US006687815B1

United States Patent
Dwyer, III et al.

(10) Patent No.: US 6,687,815 B1
(45) Date of Patent: Feb. 3, 2004

(54) METHOD AND APPARATUS FOR STORING NON-VOLATILE CONFIGURATION INFORMATION

(75) Inventors: Thomas J. Dwyer, III, Sunnyvale, CA (US); Charles D. Kunzman, Oakland, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 09/496,242

(22) Filed: Feb. 1, 2000

(51) Int. Cl.$^7$ .................. G06F 15/177; G06F 13/00
(52) U.S. Cl. ................. 713/1; 713/2; 710/104
(58) Field of Search .................. 713/1, 2; 710/104

(56) References Cited

U.S. PATENT DOCUMENTS

| | | | |
|---|---|---|---|
| 4,118,773 A | | 10/1978 | Raguin et al. |
| 4,503,491 A | | 3/1985 | Lushtak et al. |
| 4,713,759 A | | 12/1987 | Yamagishi et al. |
| 5,005,157 A | | 4/1991 | Catlin |
| 5,151,876 A | | 9/1992 | Ikeda |
| 5,245,572 A | | 9/1993 | Kosonocky |
| 5,307,497 A | | 4/1994 | Feigenbaum et al. |
| 5,579,522 A | * | 11/1996 | Christeson et al. ............ 713/2 |
| 5,630,093 A | * | 5/1997 | Holzhammer et al. ...... 711/115 |
| 5,748,537 A | * | 5/1998 | Garbers et al. ........ 365/185.08 |
| 5,754,798 A | * | 5/1998 | Uehara et al. ............. 710/104 |
| 5,822,581 A | * | 10/1998 | Christeson ................ 713/1 |

FOREIGN PATENT DOCUMENTS

JP 09306186 A * 11/1997 ........... G11C/16/06

OTHER PUBLICATIONS

IBM, Critical Page Caching in an External Memory Manager, Nov. 1, 1995, Vol 38, Issue 11, pp. 187–190.*
"DOC Dynamic EPROM Size Detector", Mayer, et al, *Motorola Inc. Technical Developments*, Schaumburg, IL, vol. 14, Dec. 1991, p. 109.
"Flash Memory BIOS for PC and Notebook Computers", Jex, IEEE, 1991.

* cited by examiner

*Primary Examiner*—Thomas Lee
*Assistant Examiner*—Suresh K Suryawanshi
(74) *Attorney, Agent, or Firm*—Robert C. Kowert; Meyertons, Hood, Kivlin, Kowert & Goetzel, P.C.

(57) ABSTRACT

A method implemented in a computer system for storing non-volatile configuration information (NVCI), wherein NVCI is stored in one or more active segments of a segmented flash memory. The NVCI consists of a series of key-value pairs. When the computer system is started, the key-value pairs are read from the active segment, beginning with the least recently stored and ending with the most recently stored. The key-value pairs are inserted into a hash table, with later-read key-value pairs replacing earlier-read key-value pairs of the same key. Write accesses to the NVCI are made to both the hash table and the active segment of flash memory. When an active segment of the flash memory is filled to a threshold capacity, current key-value pairs stored in the hash table are written to a new flash memory segment, which then becomes the active segment.

28 Claims, 2 Drawing Sheets

METHOD AND APPARATUS FOR STORING NON-VOLATILE CONFIGURATION INFORMATION

BACKGROUND OF THE INVENTION

1. Field of the Invention

The present invention relates generally to computer systems and more specifically to a method and apparatus for storing non-volatile configuration information in a flash memory and accessing this information in a manner which does not negatively impact system performance.

2. Description of Related Art

Traditionally, hardware configuration in computer systems was handled using special protocols which were implemented in the hardware itself. Hardware components were manually configured, and it was likely that a particular system would need to be reconfigured only infrequently. Components for modem computer systems, however, are increasingly designed in a modular fashion which allows the hardware configurations of individual computer systems to be very flexible. Demand for custom configurations has grown along with the flexibility of computer hardware.

As a result of the flexibility of computer hardware, the configuration of computer systems is becoming an increasingly complex task. This has in turn resulted in a need for special configuration parameters that can be manipulated to control the setup and functionality of both the computer hardware and the software that utilizes the hardware. These configuration parameters are used both by the operating system in automatically configuring the system and by the user in manually configuring the system.

While the configuration parameters allow system configurations to be easily changed, it is desirable to maintain the current values of the parameters, even when the system is powered down. By maintaining the values of the configuration parameters, the need to entirely reconfigure the system every time it is powered down or rebooted is eliminated. Because the configuration parameters need to be maintained through power cycles, they are referred collectively as non-volatile configuration information, or simply NVCI.

Many of the configuration parameters are critical to the basic boot process of a computer system. The NVCI must therefore be stored in a manner which is persistent and reliable. It is also desirable to make the NVCI available with the greatest possible performance. Typically, NVCI has been stored in a battery-powered SRAM. Battery-powered SRAM, however, is relatively expensive and data stored in the SRAM may be lost as a result of battery failure. It would therefore be desirable to use a more reliable system for storing NVCI.

Another problem with traditional implementations of NVCI storage systems is that they typically use either a fixed data format or a table of contents that contains pointers to data objects that comprise the NVCI. Neither of these solutions is able to handle dynamic data types very well. Because the fixed format storage cannot be modified, it simply cannot support dynamic data types. The sizes of data objects are also limited by the original space allocations for the data objects. Although systems that use a table of contents and pointers are more flexible than the fixed-data systems, if dynamic data types are to be supported, they require the use of complicated algorithms to determine space allocations for the data objects.

SUMMARY OF THE INVENTION

One or more of the problems outlined above may be solved by the various embodiments of the present invention. Broadly speaking, the invention comprises storing the NVCI in a flash memory and retrieving a copy of the NVCI into a working memory so that it can be quickly accessed.

In one embodiment, a computer system includes a processor, a working memory (RAM) and a flash memory. NVCI is stored in the flash memory. When the computer system is booted up, the NVCI is read from the flash memory into the working memory. When the computer system needs to read particular values from the NVCI, the copy of the NVCI in the working memory is read. When the computer system needs to write new values to the NVCI, the system writes to both the copy of the NVCI in the working memory and the copy of the NVCI in the flash memory.

In one embodiment, the system is configured to store the NVCI in the flash memory in a format which both maximizes the lifetime of the flash memory and enables the system to handle dynamic data types efficiently. The NVCI comprises a plurality of key-value pairs. The key-value pairs are stored serially in the flash memory. In other words, a key is followed by its corresponding value, which is followed by another key, and so on. The key-value pairs may also contain data indicating the size of the key and corresponding value, as well as a checksum which is used to detect errors in the key-value pairs. When the value corresponding to a key is updated, the key and the new value are written to the next available space in the flash memory. The next time the flash memory is read into the working memory, the key-value pairs are read serially from the flash memory. When a second or subsequent occurrence of a key is read, the value previously read into the working memory for that key is overwritten with the subsequent value. The working memory therefore contains only one copy of each key and its corresponding value, even though there may be several different values corresponding to the key in the flash memory.

In one embodiment, the flash memory comprises a segmented flash memory. Each of the segments of the flash memory can be erased independently of the other segments. The NVCI is stored in one of the segments. When additional key-value pairs are written to the segment and it reaches a predetermined capacity, a new segment is selected and the current NVCI (i.e., each key and its most recent value) are written to the new segment. If each of the segments has previously been used (without being erased), a least-recently used segment is selected and is erased before the current NVCI is written to it.

One embodiment comprises a method implemented in a computer system for storing NVCI which uses less expensive memory, yet provides higher performance than conventional methods. In this embodiment, NVCI is stored in one or more active segments of a segmented flash memory. The NVCI consists of a series of key-value pairs which are stored in contiguous locations in the flash memory, beginning with the lowest address. When the computer system is started, the key-value pairs are read from the flash memory, beginning with the least recently stored and ending with the most recently stored (in most instances, the key-value pairs are read beginning with the lowest memory address and ending with the highest.) The key-value pairs are inserted into a hash table in working memory. Later-read key-value pairs replace earlier-read key-value pairs which have the same key in the hash table. Read accesses to the NVCI are made to the hash table. Write accesses to the NVCI are made to both the hash table and the flash memory. Write accesses to the hash table replace the values which are already stored in the table. Write accesses to the flash memory are stored in "logging" fashion (i.e., they are stored in the next available memory location.) When an active segment of the flash memory is filled to a threshold capacity, the key-value pairs stored in the hash table are written to a new segment, which then becomes the active segment.

The present invention includes many other embodiments which will be apparent from this disclosure.

BRIEF DESCRIPTION OF THE DRAWINGS

Other objects and advantages of the invention will become apparent upon reading the following detailed description and upon reference to the accompanying drawings in which.

Figure 1:
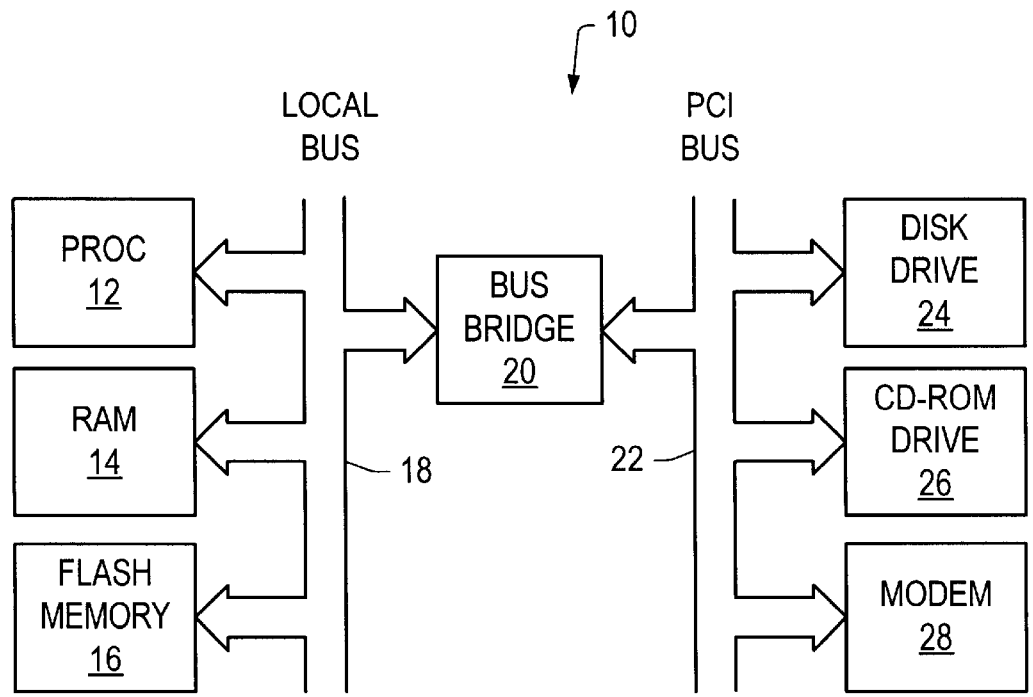
FIG. 1 is a block diagram illustrating the configuration of an exemplary computer system in one embodiment.

While the invention is susceptible to various modifications and alternative forms, specific embodiments thereof are shown by way of example in the drawings and will herein be described in detail. It should be understood, however, that the drawing and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

A preferred embodiment of the invention is described below. It should be noted that this and any other embodiments described below are exemplary and are intended to be illustrative of the invention rather than limiting.

Referring to FIG. 1, a block diagram illustrating the configuration of an exemplary computer system 10 is shown. Computer system 10 includes a processor 12, a working memory 14 and a flash memory 16. These components are each coupled to a local bus 18. Local bus 18 is coupled to a PCI bus 22 via bus bridge 20. A variety of peripheral devices (e.g., disk drive 24, CD-ROM drive 26 and modem 28) may be coupled to PCI bus 22. Although only a few basic components of computer system 10 are shown in the figure, many more devices may be included. For example, PCI bus 22 can accommodate up to 32 devices, some of which may be bridges to other buses which may include even more devices.

Computer system 10 may be configured in a number of ways. Consequently, a number of configuration parameters associated with the hardware and software configurations of the computer system must be set up. These configuration parameters may include various types of information, such as host names, IP addresses, debug options, etc. The configuration parameters will be referred to collectively herein as non-volatile configuration information (NVCI). The NVCI is stored in a persistent storage device such as flash memory 16. This allows the computer system to maintain its configuration through cycles in which the computer system is powered up and powered down.

Flash memory is non-volatile—when a flash memory device is powered down, it retains the data that is stored in it. Flash memory devices are similar to EPROMS (erasable programmable read only memories,) except that flash memories are electrically erasable (EPROMS are erasable by exposing them to UV light.) It should be pointed but that flash memories have a limited lifetime. That is, they can only be erased a limited number of times. After the maximum number of erasures has been reached the flash memory may no longer operate reliably. It is therefore important to make the most efficient use of flash memories and to minimize the number of times the memory (or a particular segment thereof) is cleared (erased.)

Figure 2:
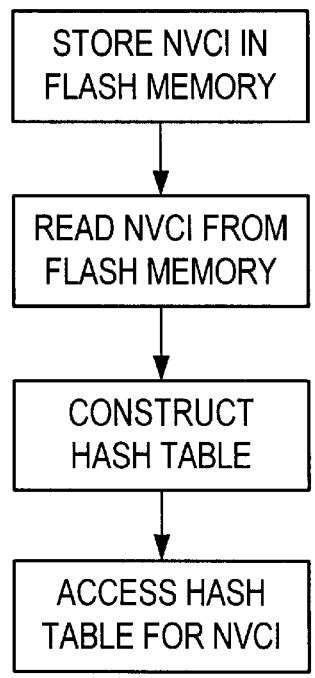
FIG. 2 is a flow diagram illustrating the method by which the NVCI is accessed in one embodiment.

Referring to FIG. 2, a flow diagram illustrating the method by which the NVCI is accessed is shown. The key-value pairs which form the NVCI are initially stored in the flash memory. When the computer system is booted up or restarted (i.e., at boot time,) the processor reads the key-value pairs from the flash memory into the working memory. As the key-value pairs are read from the flash memory, they are inserted into a hash table. During normal operation of the computer system, the configuration parameters which are needed are read from the hash table. Thus, the system uses relatively inexpensive flash memories for persistent storage of the NVCI, but at the same time achieves high performance by maintaining a hash table containing the current NVCI values in the working memory.

Figure 3:
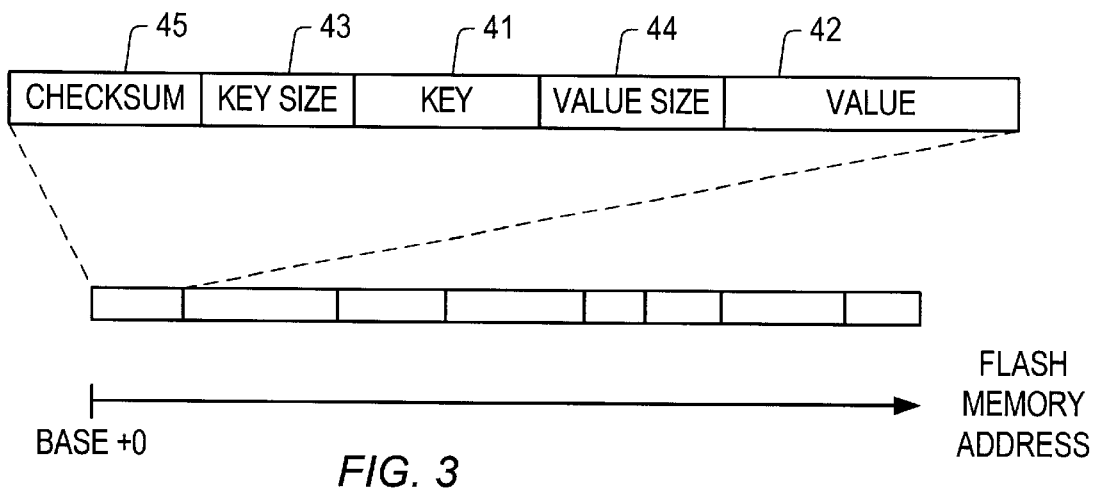
FIG. 3 is a diagram illustrating the manner in which key-value pairs are stored in a flash memory in one embodiment.

The key-value pairs are stored serially in the flash memory, beginning with the oldest (least recent) entry and ending with the most recent entry. ("Entry" is used here to refer to a particular occurrence of a key-value pair and associated data.) The least recent entry is normally located at the lowest address, while the most recent entry is normally located at the highest address. The manner in which the entries are stored in the flash memory is shown graphically in FIG. 3. In one embodiment, the flash memory is segmented, and the first key-value pair is stored at the lowest address of an "active" (i.e., currently used) segment of the flash memory. The lowest memory address in FIG. 3 is therefore indicated as "base+0". The entries are stored in contiguous locations, with no unused memory between succeeding entries. One or more entries may each contain the same key—the entry having the highest address in the flash memory will contain the most recent value corresponding to the key. (It should be noted that this may not be true for some implementations which use more than one segment of a segmented flash memory, but will be true within each segment.) As can be seen from the figure, entries containing key-value pairs of varying lengths can be accommodated without difficulty.

The serial storage of the key-value pairs in the flash memory provides flexibility in handling the different configuration parameters in the NVCI. Unlike convention fixed format storage of configuration parameters, the serial storage scheme easily handles dynamic data types. Further, this scheme has advantages over systems which use tables of contents and pointers to store configuration parameters having dynamic data types. Since the configuration parameters are serially logged in the flash memory, the complicated algorithms required for space allocation in table-of-contents systems are avoided. Because the use of pointers is eliminated, bugs relating to pointer manipulation are also avoided.

In the embodiment depicted in FIG. 3, each entry in the flash memory consists not only of key 41 and value 42, but also key size 43, value size 44 and checksum 45. Key size 43 and value size 44 facilitate reading of the key-value pairs from the flash memory. Key size 43 immediately precedes key 41 and indicates the amount of memory occupied by key 41 in bytes. Value size 44 immediately precedes value 42 and indicates the number of bytes of the flash memory which are required to store value 42. Checksum 45 is a fixed-length checksum which is used to detect errors in the remainder of the entry.

When the computer system boots up (or restarts,) it constructs a hash table in the working memory. The hash table is used to store a working copy of the NVCI. As each NVCI entry is read from the flash memory, its key is hashed and the value is placed in the corresponding location in the hash table. When a value has already been stored in the hash table for a particular key and a subsequent entry for that same key is read, the value in the second entry displaces the value which was contained in the first entry. Thus, the most recently read value corresponding to each key is stored in the hash table. Since the flash memory is read in the same order it was written (i.e., from the lowest address to the highest,) the most recent value for each of the keys stored in the flash memory is also stored in the hash table (while obsolete values are discarded.)

During runtime, it may be necessary for the computer system to read the NVCI to determine the system's configuration, or simply to provide one of the configuration parameters to a process or device. The appropriate configuration parameters are retrieved from the hash table in the working memory. Since the hash table includes the most recent entries for each of the configuration parameters included in the NVCI, there is no need to access the flash memory. Read accesses of the NVCI are therefore made without any degradation of the performance of the computer system.

Figure 4:
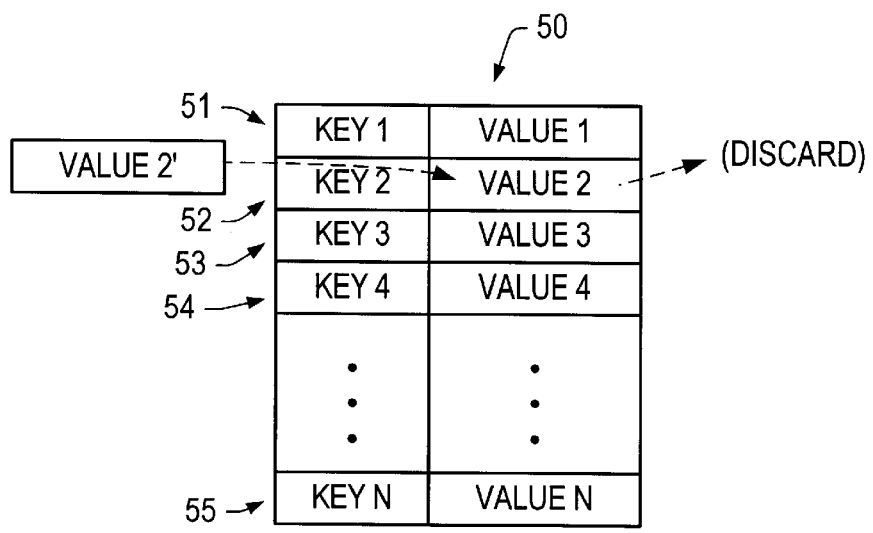
FIG. 4 is a diagram illustrating the manner in which key-value pairs are stored in a hash table in working memory and replaced by new values.

It may also be necessary during runtime to update the configuration of the computer system. Changes to the configuration are recorded by updating the corresponding parameter in the NVCI. Therefore, when a new configuration is stored, new key-value pairs indicating the changes are stored in the hash table. The new values of the key-value pairs replace the old values so that the hash table contains only the current value for each key. This is shown graphically in FIG. 4. This figure depicts a hash table 50 and a series of entries 51–55. Each entry comprises a key and a corresponding value. When a particular configuration parameter is updated, the corresponding key and value (key 2 and value 2' in the figure) are inserted into the hash table. The new value (value 2') replaces the old value (value 2) in the table, so that each key in the table only has one corresponding value.

Because the hash table is stored in the working memory, which is not a persistent storage means, storing the updated values in the hash table alone is not sufficient to ensure that the system configuration will be stored through a power cycle (i.e., when the computer system is powered down and powered back up,) a reset or a similar event. The new key-value pairs are therefore also written through to the flash memory, which is a persistent storage device. While write accesses to the flash memory may not be completed quickly, this does not degrade the performance of the computer system since configuration parameters are read from the hash table when needed. The write accesses to the flash memory can therefore proceed in the background without causing the processor to wait. Moreover, when a configuration parameter changes and needs to be written to the flash memory, only the changed parameter is written—there is no need to write those configuration parameters which have not changed to the flash memory.

Figure 5:
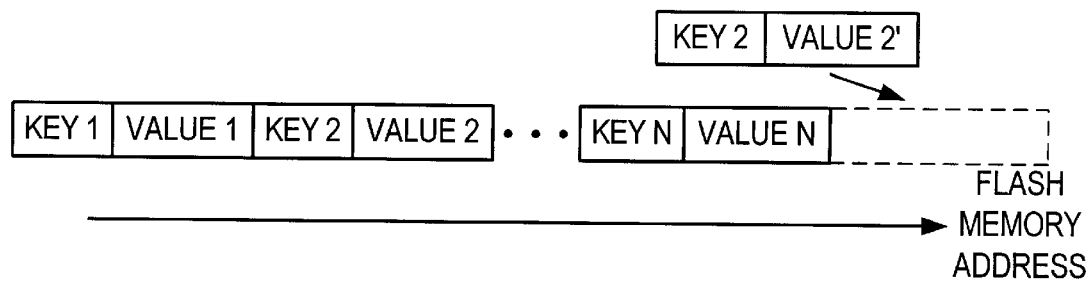
FIG. 5 is a diagram illustrating the manner in which key-value pairs are stored in a flash memory and new entries are logged at the end of the previously stored entries.

When a configuration parameter is written to the flash memory, it does not physically replace a previously stored value of the parameter. Instead, a corresponding key-value pair is written to the next available location in the flash memory. This is shown graphically in FIG. 5. It can be seen from this figure that the key-value pairs are serially stored in contiguous memory locations and are not overwritten. The presence of several entries for the same key does not raise ambiguity as to the current value corresponding to the key, because the computer system does not read any of the entries from the flash memory at runtime—they are only read at boot-up (or restart) to initialize the hash table, and then the current (most recently stored) value for each key is the only one which is not overwritten. (It should be noted that, while only the keys and corresponding values of the key-value pair entries are shown in FIG. 5, the entries may include other information, such as the data sizes and checksums shown in FIG. 3. Also, although the key-value pairs are shown as pairs 1, 2 . . . N, they need not be stored in any particular order.)

Because updates to the computer system's configuration parameters are appended to the existing NVCI entries in the flash memory, the memory is gradually filled up as updates are made to the configuration parameters. Even though the number of configuration parameters, hence the number of key-value pairs, used by the computer system may remain fixed, the number of obsolete entries in the flash memory will grow. When the flash memory is filled, or when a predetermined threshold capacity is reached, the flash memory must somehow be refreshed so that additional modifications to the configuration parameters can be stored.

In the case of a single conventional flash memory, the current configuration parameters have to be stored in a location other than the flash memory while the flash memory is erased. The current configuration parameters are then written back to a series of contiguous locations in the flash memory, beginning with the lowest address. Since the obsolete entries are not written back to the flash memory, this has the same effect as if only the obsolete entries were erased and the current entries were condensed and moved the lowest addresses in the flash memory.

If the configuration parameters are stored only in the hash table in the working memory (which is not persistent,) this information could be lost if the computer system were powered down or reset before the configuration parameters were written back to the flash memory. Therefore, in a preferred embodiment, the NVCI is stored in a segmented flash memory. A segmented flash memory is divided into several chunks, or segments, which can be independently erased. (A conventional flash memory, on the other hand, is only erasable in its entirety.) The segmented flash memory is used in essentially the same way as the conventional flash memory, but each segment is, for the most part, handled as a small, independent flash memory. When an active segment is filled, however, the NVCI can be written to another segment which has already been erased. The second segment can then be made the active segment. This process can be repeated when the second segment is filled. The next segment to be used as the active segment can be selected in round-robin fashion, or the least recently used inactive segment may be selected. Thus, the risk of losing the configuration parameters while the flash memory is being refreshed is avoided. (It should be noted that this advantage may also be provided in a system which employs more than one flash memory to store the NVCI.)

Another advantage of segmented flash memory is that, if the NVCI is confined to a single segment of the flash memory, it may take less time to read the NVCI into the working memory at startup. Immediately after each type of flash memory has been cleared, reading the NVCI into working memory will take the same amount of time in either case, because both the segmented and conventional flash memories contain the same amount of data. Once the NVCI has filled the current segment in a segmented flash memory, however, the current entries are copied into a new segment so that only a minimal amount of space is occupied in the new (now current) segment. In the conventional flash memory, on the other hand, the NVCI (including obsolete entries) takes up space which is at least the equivalent of an entire segment. In other words, the non-segmented flash memory has not been cleared, so it still contains the obsolete data. Because there is less data to read in the segmented memory, it will take less time to read the NVCI from it than from the conventional flash memory. (It should be noted that, although the segmented flash memory is cleared more often, only one segment at a time is cleared, so the lifetime of the segmented flash memory is not diminished any more quickly than the conventional flash memory.)

While the description above is directed primarily to embodiments in which the NVCI is stored in a single segment of the flash memory, it is contemplated that more than one segment may be active at the same time. For example, it may be desirable to maintain isolated sets of configuration parameters. In one embodiment, a computer system may use a first group of configuration parameters which are updated infrequently and a second group of configuration parameters which are updated more often. If the first group of configuration parameters is maintained in a separate segment of the flash memory, it will fill up more slowly than the segment containing the second group of parameters and will have to be recopied and erased less frequently than the segment containing the second group. The overall number of erasures of the segments will therefore be reduced and the lifetime of the flash memory extended.

While the present invention has been described with reference to particular embodiments, it will be understood that the embodiments are illustrative and that the invention scope is not limited to these embodiments. Many variations, modifications, additions and improvements to the embodiments described are possible. These variations, modifications, additions and improvements may fall within the scope of the invention as detailed within the following claims.

What is claimed is:

1. A method, comprising:
   retrieving configuration parameters from a persistent storage;
   storing the configuration parameters in a working memory;
   retrieving the configuration parameters by reading the configuration parameters from the working memory; and
   updating the configuration parameters by writing one or more of the configuration parameters to both the working memory and the persistent storage.

2. The method of claim 1, wherein said updating the configuration parameters comprises:
   overwriting an existing value in the working memory for one of the configuration parameters with an updated value for the one of the configuration parameters; and
   writing the updated value for the one of the configuration parameters to a new location in the persistent storage without overwriting an existing value in the persistent storage for the one of the configuration parameters.

3. The method of claim 2, wherein said writing the updated value for the one of the configuration parameters to a new location in the persistent storage comprises writing the updated value to a next available location in a portion of the persistent storage storing existing values for the configuration parameters.

4. The method of claim 3, wherein the portion of the persistent storage storing existing values for the configuration parameters comprises a sequentially addressed segment of a flash memory device, wherein said new location begins at the next sequential address after an ending address of the most recently written existing configuration parameter value in the segment.

5. The method of claim 1, wherein said updating the configuration parameters comprises:
   writing an updated value for each of the one or more of the configuration parameters to a respective new location in a flash memory segment of the persistent storage without overwriting an existing parameter value in the flash memory segment;
   wherein when the flash memory segment is filled to a predetermined threshold, writing the configuration parameters to another segment of the flash memory.

6. The method of claim 5, wherein said writing the configuration parameters to another segment of the flash memory comprises writing only the configuration parameters from the working memory to the another segment so that only current configuration parameter values are written to the another segment, whereas current and non-current parameter values are stored in the segment filled to a predetermined threshold.

7. The method of claim 5, wherein the configuration parameters are retrieved from and written to an active segment only of the flash memory device, wherein the another segment becomes the active segment when the previously active segment is filled to the predetermined threshold.

8. The method of claim 7, wherein the active segment is erased prior to initially writing the configuration parameters to the active segment.

9. The method of claim 8, wherein the flash memory device comprises a plurality of segments, wherein a next active segment is selected in a round robin fashion when the current active segment is filled to the predetermined threshold.

10. The method of claim 1, wherein said retrieving configuration parameters from a persistent storage comprises retrieving both current and non-current values for one or more of the configuration parameters.

11. The method of claim 10, wherein said storing the configuration parameters in a working memory comprises overwriting non-current values with current values for one or more of the configuration parameters.

12. The method of claim 1, wherein said retrieving configuration parameters from a persistent storage comprises retrieving the configuration parameters from a portion of the persistent storage in an order the configuration parameters were written to the portion of the persistent storage.

13. The method of claim 12, wherein said storing the configuration parameters in a working memory comprises storing the configuration parameters in the working memory in the order from said retrieving, wherein a later retrieved value for one of the configuration parameters overwrites a previously retrieved value for the same configuration parameter.

14. The method of claim 1, wherein each of the configuration parameters comprises one or more key-value pairs stored with data indicating a size of the key of and a size of the value of each respective key-value pair.

15. A system, comprising:

a processor;

a volatile working memory coupled to the processor; and a non-volatile memory coupled to the processor;

wherein the processor is configured to read configuration parameters stored in the non-volatile memory into the working memory; and wherein the processor is further configured to access the configuration parameters from the working memory once the configuration parameters have been stored in the working memory, and update the configuration parameters to both the working memory and the non-volatile memory.

16. The system of claim 15, wherein to update the configuration parameters the processor is configured to:

overwrite an existing value in the working memory for one of the configuration parameters with an updated value for the one of the configuration parameters; and write the updated value for the one of the configuration parameters to a new location in the non-volatile memory without overwriting an existing value in the non-volatile memory for the one of the configuration parameters.

17. The system of claim 16, wherein to write the updated value for the one of the configuration parameters to a new location in the non-volatile memory, the processor is configured to write the updated value to a next available location in a portion of the non-volatile memory storing existing values for the configuration parameters.

18. The system of claim 17, wherein the portion of the non-volatile memory storing existing values for the configuration parameters comprises a sequentially addressed segment of a flash memory device, wherein said new location begins at the next sequential address after an ending address of the most recently written existing configuration parameter value in the segment.

19. The system of claim 15, wherein to update the configuration parameters the processor is configured to:

write an updated value for each of the one or more of the configuration parameters to a respective new location in a flash memory segment of the non-volatile memory without overwriting an existing parameter value in the flash memory segment;

wherein when the flash memory segment is filled to a predetermined threshold, the processor is configured to write the configuration parameters to another segment of the flash memory.

20. The system of claim 19, wherein to write the configuration parameters to another segment of the flash memory, the processor is configured to write only the configuration parameters from the working memory to the another segment so that only current configuration parameter values are written to the another segment, whereas current and non-current parameter values are stored in the segment filled to a predetermined threshold.

21. The system of claim 19, wherein the processor is configured to retrieve the configuration parameters from and write the configuration parameters to an active segment only of the flash memory device, wherein the another segment becomes the active segment when the previously active segment is filled to the predetermined threshold.

22. The system of claim 21, wherein the active segment is erased prior to initially writing the configuration parameters to the active segment.

23. The system of claim 22, wherein the flash memory device comprises a plurality of segments, wherein a next active segment is selected in a round robin fashion when the current active segment is filled to the predetermined threshold.

24. The system of claim 15, wherein the processor is configured to retrieve both current and non-current values for one or more of the configuration parameters from the non-volatile memory.

25. The system of claim 24, wherein to store the configuration parameters in the working memory, the processor is configured to overwrite non-current values with current values for one or more of the configuration parameters.

26. The system of claim 15, wherein to retrieve configuration parameters from the non-volatile memory, the processor is configured to retrieve the configuration parameters from a portion of the non-volatile memory in an order the configuration parameters were written to the portion of the non-volatile memory.

27. The system of claim 26, wherein to store the configuration parameters in the working memory, the processor is configured to store the configuration parameters in the working memory in the order from said retrieving, wherein a later retrieved value for one of the configuration parameters overwrites a previously retrieved value for the same configuration parameter.

28. The system of claim 15, wherein each of the configuration parameters comprises one or more key-value pairs stored with data indicating a size of the key of and a size of the value of each respective key-value pair.

* * * * *